(12) United States Patent
Suss et al.

(10) Patent No.: US 12,550,679 B2
(45) Date of Patent: Feb. 10, 2026

(54) SUBSTRATE HOLDER DEVICE AND METHOD FOR BONDING

(71) Applicant: EV Group E. Thallner GmbH, St. Florian am Inn (AT)

(72) Inventors: Jurgen Markus Suss, St. Florian am Inn (AT); Jurgen Mallinger, St. Florian am Inn (AT)

(73) Assignee: EV GROUP E. THALLNER GMBH, St. Florian am Inn (AT)

( * ) Notice: Subject to any disclaimer, the term of this patent is extended or adjusted under 35 U.S.C. 154(b) by 643 days.

(21) Appl. No.: 18/011,226

(22) PCT Filed: Jul. 8, 2020

(86) PCT No.: PCT/EP2020/069242
§ 371 (c)(1),
(2) Date: Dec. 19, 2022

(87) PCT Pub. No.: WO2022/008047
PCT Pub. Date: Jan. 13, 2022

(65) Prior Publication Data
US 2023/0230871 A1    Jul. 20, 2023

(51) Int. Cl.
| | | |
|---|---|---|
| H01L 21/683 | (2006.01) |
| B25B 11/00 | (2006.01) |
| F16K 11/076 | (2006.01) |
| F16K 11/085 | (2006.01) |
| H01L 21/67 | (2006.01) |

(52) U.S. Cl.
CPC ........ *H01L 21/6838* (2013.01); *B25B 11/005* (2013.01); *F16K 11/076* (2013.01); *F16K 11/0856* (2013.01); *H01L 21/67092* (2013.01)

(58) Field of Classification Search
CPC .......... H01L 21/6838; H01L 21/67092; B25B 11/005; F16K 11/076; F16K 11/0856
See application file for complete search history.

(56) References Cited

U.S. PATENT DOCUMENTS

| | | |
|---|---|---|
| 9,865,494 B2 | 1/2018 | Ichinose |
| 10,707,112 B2 | 7/2020 | Volz et al. |
| RE48,429 E | 2/2021 | Ichinose |
| 11,062,934 B2 | 7/2021 | Volz et al. |

(Continued)

FOREIGN PATENT DOCUMENTS

| | | |
|---|---|---|
| CN | 109585353 A | 4/2019 |
| CN | 111383981 A | 7/2020 |

(Continued)

OTHER PUBLICATIONS

International Search Report from corresponding International Patent Application No. PCT/EP2020/069242, dated Mar. 19, 2021 along with English-language translation.

(Continued)

*Primary Examiner* — Seahee Hong
(74) *Attorney, Agent, or Firm* — RENNER, OTTO, BOISSELLE & SKLAR, LLP

(57) ABSTRACT

The invention relates to a substrate holder device at least including at least one control valve and at least one substrate holder with a substrate holder surface and a substrate holder rear side. Furthermore, the invention relates to bonding device and a method for bonding.

13 Claims, 3 Drawing Sheets

(56) References Cited

U.S. PATENT DOCUMENTS

| | | | |
|---|---|---|---|
| 11,417,560 | B2 | 8/2022 | Scholz-Goerlach et al. |
| 2016/0111318 | A1 | 4/2016 | Ichinose |
| 2017/0219504 | A1 | 8/2017 | Volz et al. |
| 2018/0174884 | A1 | 6/2018 | Ichinose |
| 2019/0221467 | A1 | 7/2019 | Scholz-Goerlach et al. |
| 2019/0368621 | A1 | 12/2019 | Marchand et al. |
| 2019/0368630 | A1* | 12/2019 | Fortner ............... F16K 37/0041 |
| 2020/0312701 | A1 | 10/2020 | Volz et al. |

FOREIGN PATENT DOCUMENTS

| | | |
|---|---|---|
| DE | 10 2016 101 842 A1 | 8/2017 |
| DE | 10 2016 106 706 A1 | 10/2017 |
| EP | 3 001 451 A1 | 3/2016 |
| JP | H07-66093 A | 3/1995 |

OTHER PUBLICATIONS

Written Opiniont from corresponding International Patent Application No. PCT/EP2020/069242, dated Mar. 19, 2021.

* cited by examiner

SUBSTRATE HOLDER DEVICE AND METHOD FOR BONDING

FIELD OF THE INVENTION

The invention relates to a substrate holder device, a bonding device and a method for bonding substrates.

BACKGROUND OF THE INVENTION

The progressive miniaturisation in almost all areas of microelectronics and microsystem technology provides for a constant development of all technologies, with the aid of which the density of all types of functional units on substrates can be increased. These functional units include for example microcontrollers, memory components, MEMS, all kinds of sensors or microfluid components.

The techniques for increasing the lateral density of these functional units has been greatly improved in recent years. In some subsectors of microelectronics or microsystem technology, even to the extent that a further increase in the lateral density of the functional units is almost no longer possible. In microchip production, the maximum achievable resolution limit for structures to be produced lithographically has already as good as been reached. Physical or technological limitations have therefore no longer permitted any increase at all in the lateral density of functional units in recent years.

The industry has already been meeting this problem for several years by the development of 2.5D and 3D technologies. With the aid of these technologies, it is possible to align functional units with one another, to stack them above one another, to permanently bond them with one another and to crosslink them with one another by corresponding strip conductors. For the stacking technology, it is unimportant how the functional units are constituted. In other words, the same or different units can be bonded with one another with a similar technology. It is the aim of the technologies, in particular, to leave the chip surface unchanged and to multiply the computing capacity and the number of components.

One of the key technologies for the implementation of such structures is permanent bonding. Permanent bonding is understood to mean all processes, with the aid of which substrates can be bonded with one another in such a way that their separation is only possible with a high energy input and an accompanying destruction of the substrates. There are different kinds of permanent bonding.

One of the most important permanent bonding processes is fusion bonding, which is also referred to as direct bonding or molecular bonding. Fusion bonding is understood to mean the process of permanently joining two substrates via the formation of covalent bonds. Fusion bonds arise chiefly at the surfaces of non-metallic non-organic materials.

The person skilled in the art knows that, when two treated (in particular polished, lapped, forged, oxide-free, identical) metal surfaces are jointed, permanent bonding in the form of a metal bond preferably takes place automatically. In the case of substrate surfaces such as silicon or silicon oxide, a so-called pre-bond takes place, which is transformed into a permanent bond by a subsequent heat treatment process. The creation of the pre-bond preferably takes place at room temperature. In a very particularly preferred embodiment, the substrate surfaces are so clean that the temperature required to produce the permanent bond can be reduced to a minimum. In the ideal case, the production of the permanent bond for all kinds of substrate surfaces takes place immediately and without a pre-bonding step, in particular without an additional heat treatment step.

Pre-bonding methods are processes in which two substrates are bonded together by van-der-Waals forces alone. This bonding process takes place primarily between the silicon substrates and/or silicon oxide substrates. The bond thus produced is referred to as a pre-bond, since it involves a preliminary stage in a permanent bonding process. In the semiconductor industry, it is very often desired to release a (temporary) bond again produced by a pre-bond, if it is found after the pre-bonding that two substrates have not been aligned optimally with one another or are even aligned incorrectly. The two substrates joined together with a pre-bond can usually be separated from on another again without damage. In contrast with the other bonding processes mentioned in the publication, a fusion bonding process manages completely without bonding adhesive, in particular as a pre-bonding process.

It is known that the pre-bond can be produced for hybrid bonds with fusion bonding processes. Oxide-oxide bonds are produced as with the usual fusion bonding, which, especially with hybrid bonds, include conducting contacts, in particular copper islands for the through-connection. The copper islands are so-called TSV-s, through silicon vias, which make contact with one another by the heat treatment of the pre-bonding. Hybrid bonding is an important production technology for memory chips, or read-out units for image capturing sensors (backside illuminated image sensors). In other words, hybrid bonding is an important technology for 2.5D or 3D processes.

Hybrid bonds are deemed technologically to be a challenge, which require increased alignment accuracy and have increased requirements for freedom from particles.

For bonding, in particular fusion bonding, the substrate are fixed by substrate holders. Substrate holders include fixing elements. The fixing elements can in particular be electronically actuated or controlled, so that a switching behaviour of the fixing can take place computer-assisted, in particular automated.

Vacuum fixing is the preferred type of fixing. Vacuum fixing preferably includes a plurality of vacuum tracks, which emerge at the surface of the substrate holder. The vacuum tracks can preferably be actuated individually. In one application, several vacuum tracks are combined to form vacuum track segments, which can be actuated individually. The vacuum tracks can be used for evacuation or flooding. Each vacuum segment, however, is preferably independent of the other vacuum segments. It is thus possible to configure vacuum segments which can be actuated individually. The vacuum segments are preferably designed in an annular shape, since most substrates are circular. A targeted, radially symmetrical fixing and/or release of a substrate from the substrate holder, in particular implemented from inside outwards, is thus enabled. Any switching concepts can be implemented in further known fixings.

The substrates are aligned with one another and jointed with one another for the automated implementation of fusion bonds. In order to be able to meet the accuracy requirements of the industry, the distortions of the bonded substrate stack must be reduced to a minimum, in the ideal case completely eliminated.

A general problem is the increased complexity of the substrate holders, because with each additional vacuum track the substrate holder requires in particular a feed line, in particular an individual control/regulation, which with electrical cabling, vacuum cabling, fastening elements amongst other things increases the space requirement of the components and raises the susceptibility of the bonder to errors. With the operation of electronic components, additional heat sources are produced, the heat generation of which affects the substrates. Accordingly, a multiplicity of unquantifiable random error sources is added during bonding, which increase the so-called run-out.

Apart from the substrate holders, which operate with vacuum fixings, there are also alternative embodiments. For example, substrate holders with electrostatic fixing, magnetic fixing, adhesive fixing, etc. are also conceivable.

Substrate holders with electrostatic fixing act via an electrostatic field on the substrate and, particularly in the case of components which are sensitive to charges, can cause damage. Substrate holders with magnetic fixing require magnetisable substrates and therefore can seldom be used.

Substrates with an adhesive fixing have the serious drawback that the fixing surface of the substrate holder is very soft and a flat, even fixing is therefore very difficult to implement.

It is therefore the aim of the present invention to specify a substrate holder device, a bonding device and a method for bonding which at least partially remove, in particular completely remove the drawbacks listed in the prior art. Furthermore, it is a problem of the present invention to specify an improved substrate holder device, a bonding device and an improved method for bonding.

SUMMARY OF THE INVENTION

The present problem is solved with the features of the coordinated claims. Advantageous developments of the invention are given in the sub-claims. All combinations of at least two features stated in the description, in the claims and/or the drawings also fall within the scope of the invention. In stated value ranges, values lying within the stated limits should also be deemed to be disclosed as limiting values and can be claimed in any combination.

In the following text, a control valve which is operated preferably pneumatically is intended, in particular a vacuum control valve.

Accordingly, the invention relates to a substrate holder device at least including:

at least one control valve and
at least one substrate holder with a substrate holder surface and a substrate holder rear side, wherein the control valve at least includes:
  a valve housing with at least one port,
  control element which is capable of being driven and is held gas-tight in the valve housing, and
  at least two openings which are formed in the valve housing and can be connected fluidically to the port,
wherein the at least two openings can be at least partially closed by driving the control element.

The substrate holder device is advantageously designed to control a plurality of openings by at least partial closing. To do this, only one, in particular mechanical, control valve is used, so that no individually electronically controllable valves, which disadvantageously emit heat, have to be incorporated in the substrate holder device. In this way, the number of valves and in particular the cabling and connection ports can advantageously be reduced. Furthermore, the run-out error can be reduced, in particular prevented, due to reduced heat input, so that the quality of the processing of the substrates can be increased. In particular, a targeted and continuous release or fixing of a substrate arranged on the substrate holder surface can advantageously take place depending on the drive, the pressure provided at the port on the medium present in the control valve and the design of the control element.

Furthermore, the invention relates to a bonding device for bonding at least two substrates facing one another, at least including at least one substrate holder device according to the invention, wherein a bond wave can be influenced, in particular controlled, by a drive speed of the valve drive and by a vacuum acting on the port or a pressure acting on the port.

The bonding device can be operated more efficiently and more effectively by the use of the substrate holder device. In particular, the heat input is reduced by the reduced number of components, as a result of which the quality is increased and the susceptibility to error is reduced. A particular advantage with the bonding device is that a bond wave can be regulated in a bonding process by the substrate holder device including the control valve. In particular, the form of the bond wave and its propagation speed can be influenced or controlled, in particular in the radial direction.

Furthermore the invention relates to a method for bonding substrates, in particular with a bonding device according to the invention, wherein a propagation speed and/or the form of an in particular radially spreading bond wave is influenced by a substrate holder device according to the invention.

In the method for bonding substrates, use is advantageously made of a bonding device which includes a substrate holder, which has a reduced heat input on account of a reduced number of components, in particular electronically controlled valves. In this way, the bonding process is more effective and more efficient. In addition, the quality of the bond connection is improved and the probability of an error occurring is reduced. When the method is used, it is possible for a bond wave to advantageously be influenced in form and speed. No individual actuation of electronic vacuum valves is required for this, since a plurality of openings is controlled by means of control valve, in particular operated purely mechanically. Advantageously, therefore, bonding of substrates can be carried out by means of the drive speed and the pressure provided through the port.

In a preferred embodiment of the substrate holder device, provision is made such that the control element includes at least one control projection, wherein the at least two openings can be at least partially closed by at least one control projection. The at least one control projection closes the at least two openings for example offset in time or simultaneously. Furthermore, a regulation or throttling of the control valve advantageously takes place by a partial closure of an opening. The at least one control projection is preferably constituted in one piece with the control element. By means of the configuration and arrangement of the control projection, controlled venting of the vacuum channel and thus a release of a substrate arranged on the substrate holder surface or a fixing of a substrate arranged on the substrate holder surface can advantageously take place.

In a preferred embodiment of the substrate holder device, provision is made such that an individual opening, closing or partial closing of the at least two openings in a specific sequence can be carried out by driving the control element. The control element can advantageously be controlled and continuously moved by controlled driving, so that an advantageously sequential and in particular regulated opening, closing or partial closing of each opening can take place individually. In this way, a mechanical control valve is provided for the semiconductor industry, which can regulate a plurality of openings, in particular openings connected to the substrate holder. Influencing of the substrate is thus advantageously enabled in a simple manner and with little heat input.

In a preferred embodiment of the substrate holder device, provision is made such that the control element is constituted as a shaft and the drive takes place in a rotational movement around the shaft. In this way, driving can advantageously take place as a rotational movement around the central axis of the shaft and in particular control projections can regulate the openings depending on the position of the shaft in the valve housing. Furthermore, a regulating program preset on the shaft by the control projections can advantageously take place continuously through the rotational movement. Advantageously, it is not necessary to set the control element back into an initial position, because after a whole rotation the regulating program can take place again without a time delay.

In a preferred embodiment of the substrate holder device, provision is made such that the control element is constituted as a piston and the drive takes place in an axial movement along the piston. A particularly reliable and continuous control of the openings can advantageously take place by means of the axial movement of the control element.

In a preferred embodiment of the substrate holder device, provision is made such that the control element is replaceable. In this way, a change of a specific sequence or of the regulating program is possible. The substrate holder device can thus be advantageously adjusted quickly and flexibly.

In a preferred embodiment of the substrate holder device, provision is made such that the at least one control projection is constituted in the form of a thread or in the form of two opposite-running threads. By means of a thread constituted along a shaft or a piston or two opposite-running threads, the closing of the openings can advantageously take place. Depending on the configuration of the port and the housing, different engagement sections and engagement sequences on the thread can be determined In a preferred embodiment of the substrate holder device, provision is made such that the valve housing is arranged with respect to the substrate holder, in particular to the rear side of the substrate holder, such that the at least two openings, preferably three or more openings, are aligned in the radial direction proceeding from a centre-point of the substrate holder surface. In this way, influencing of the substrates arranged on a substrate holder surface advantageously takes place successively in a radial direction. Furthermore, a bond wave of the substrate spreading radially from a centre-point can advantageously be influenced in a radial direction by this sequential closing of the openings.

In a preferred embodiment of the substrate holder device, provision is made such that the valve housing includes at least three openings offset along a straight line. The effect of the at least three openings is advantageously that the release or fixing of a substrate advantageously takes place along a straight line. The openings preferably have the same cross section and the same cross-sectional area. Furthermore, the at least three openings are preferably arranged regularly and at identical distances from one another along the valve housing. In this way, a bond wave can advantageously be influenced at regular distances.

In a preferred embodiment of the substrate holder device, provision is made such that the drive takes place by means of a valve drive which can be coupled with the control element, wherein the valve drive is arranged in particular outside the valve housing. An arrangement of the valve drive advantageously reduces an additional heat input in the region of the substrate holder device. Furthermore, by means of a coupling, the rotary or rotational movement can for example advantageously be separated or coupled quickly from or to the control element. In addition, a gear unit can advantageously be used for regulating the drive. Flexible and quick closing of the openings is thus possible.

In a preferred embodiment of the substrate holder device, provision is made such that at least two connection openings are formed between the substrate holder surface and the rear side of the substrate holder and the at least two connection openings are connected gas-tight to the at least two openings of the valve housing of the at least one control valve, so that a vacuum or a pressure acting through at least one port can be provided at the at least two connection openings in the area of the substrate holder surface. A substrate can thus be arranged advantageously on the substrate holder surface. In addition, further connection hoses can advantageously be dispensed with during the assembly. In particular, quicker and less error-prone closing of the openings is possible through the smaller spatial separation of the point of influence and the control valve.

In a preferred embodiment of the substrate holder device, provision is made such that a substrate arranged on the substrate holder surface can be fixed, released and/or vented depending on the specific sequence of the control valve pre-settable by the control projections in the region of the connection openings. In this way, a particularly flexible and continuous control of a bond wave is possible. Furthermore, a reduction in the propagation speed of the bond wave can also takes place as a result of venting, preferably by a provided excess pressure.

In a preferred embodiment of the method for bonding, provision is made such that the influencing takes place depending on a movement speed of the control element and on the vacuum prevailing or the pressure prevailing at the port. In this way, bonding with the least possible heat input can advantageously be carried out by setting the movement speed of the control element and the adjustable pressure at the port of the control valve. In other words, bonding can take place with the least possible run-out.

An important aspect of the invention is the devices and the method with the aid of which the port, in particular the vacuum ports of a substrate holder, can be controlled individually and/or in zones, particular preferably continuously. Continuously means in particular in a specific sequence. The control outlay is thus advantageously reduced by means of mechanical control curves. With the in particular continuous control of the vacuum ports of a substrate holder, the substrate arranged on the substrate holder is released or fixed in the sequence preset by the control element, so that in particular a bond wave proceeding from the centre-point of the substrate holder is influenced or controlled as desired.

The vacuum control valve is preferably controlled via the shaft by means of the valve drive. It is however possible to carry out a fusion bond in a controlled manner through the operation of the valve drive with a feedback loop, wherein the vacuum valve itself, as a controlled component, has no control. In this regard, the bond wave can be influenced, in particular in terms of its speed and form, by means of the valve drive, the valve pressure prevailing at the port and by the dimensioning, in particular of the control projections It is also conceivable for a bonding device to include one or more sensors, so that a bond wave can be traced and analysed during bonding. By calculation, the bonding device can preferably automatically provide improved influencing of the bond wave, for example by regulating the drive speed of the valve drive, by changing the pressure provided at the port or by a replacement of the control element.

It is desirable to equip a vacuum substrate holder with a plurality of control valves, in particular vacuum control valves for influencing a fusion bond. This serves in particular to regulate the vacuum at a vacuum substrate holder, which includes vacuum zones switchable individually or in groups. The switching of the vacuum zones takes place with the vacuum control valve or particularly preferably with a plurality of vacuum control valves in particular operated in a controlled manner.

In a particularly advantageous embodiment of the invention, the vacuum inlets of the vacuum control valve are produced in a common clamping operation with the vacuum feed-throughs of the substrate holder.

The use of the vacuum substrate holder with the vacuum control valve is understood as an independent method. The method serves to influence in particular a fusion bond of two substrates with at least one vacuum control valve, in order to minimise the run-out of the substrate stack.

The invention relates in particular to a vacuum control valve for the actuation of a plurality of inlets, in particular at a vacuum substrate holder for fusion bonding, in order to achieve a controlled and reproducible release of the substrate from the substrate holder, with little control or regulation outlay. The vacuum control valve can switch more than one vacuum track, so that the individual valve controls are replaced. In particular, the complexity and the susceptibility to error of the bonder are thus reduced. The number of vacuum lines and vacuum control valves and cabling are reduced, so that the control outlay is reduced, as a result of which the software of the device is simplified, which in turn reduces the susceptibility to error of the bonder. As a result of the absent components, the thermal loading of the substrate holder by means of parasitic heat sources is in particular reduced, the effect of which reduces in particular the total run-out of the bonded substrate stack. The minimisation of the run-outs leads to an improvement in quality.

A novel vacuum control valve enables a hardware-based control of the bonding process. The control valve is preferably a purely mechanical control valve. The vacuum control valve is in operation like a hardware-coded program which can be converted. The control acts in particular on the execution speed of the program, which is fixed by the control valve. A program change is consequently advantageously possible with a replacement of the shaft of the vacuum control valve.

Control Valve

A control valve, in particular a vacuum control valve, is understood in particular to mean a vacuum control valve for influencing the vacuum with
  a valve housing, which separates the internal area with a vacuum gas-tight from the external atmosphere, and
  is provided with a suction port provided in the vacuum housing and in particular with a plurality of inlet openings and
  contains a valve drive for generating a movement, in particular rotation outside the valve housing, and
  is provided with a shaft which is coupled with the valve drive, which is passed gas-tight through the valve housing, which transmits the rotary motion from the drive into the interior region of the vacuum control valve and
  which regulates the flow of the vacuum between the inlet openings and the suction ports, in particular opens, closes or partially opens the inlet openings.

The control valve, in particular vacuum control valve, is understood in a further preferred embodiment to be, in particular, a vacuum control valve for influencing the vacuum with
  a valve housing, which separates gas-tight the interior with a vacuum from the external atmosphere, and
  is provided with a suction port provided in the vacuum housing and in particular a plurality of inlet openings and
  contains a valve drive for generating a movement, in particular a translation outside the valve housing, and
  is provided with a linear piston, which is coupled with the valve drive, and which is passed gas-tight through the valve housing, which transmits the stroke movement from the drive into the interior of the vacuum control valve and
  which regulates the flow of the vacuum between the inlet openings and the suction ports, in particular opens, closes or partially opens the inlet openings.

Substrate Holder

A substrate holder in the sense of the invention includes at least one control valve described above for regulating the vacuum at the substrate holder, in particular a vacuum substrate holder, which includes vacuum zones which can be switched individually or in groups. The vacuum control valve is preferably connected gas-tight to the vacuum substrate holder. The connection of the vacuum control valve to the vacuum substrate holder takes place in particular on the side of the vacuum substrate holder facing away from the substrates (rear side) or on a front side of the vacuum substrate holder.

In a particularly advantageous embodiment of the invention, the vacuum inlets of the vacuum control valve are produced in a common clamping operation with the vacuum feed-throughs of the vacuum substrate holder. The production tolerances and the jointing tolerances can thus be eliminated. With the removal of gas-tight connections between the vacuum substrate holder and the vacuum control valve, the in particular flexible cabling of the vacuum ports can be omitted, so that the susceptibility of the assembly to error is reduced.

Bonder

A vacuum substrate holder can be used to influence a fusion bond in a bonder, in particular a fusion bonder which contains at least one control valve.

The use of a substrate holder device with the control valve in a bonding device is regarded as an in particular independent invention. The method serves to influence in particular a fusion bond of two substrates with at least one vacuum control valve, in order to minimise the run-out of the substrate stack.

Use of the Control Valve in a Bonding Device

A first embodiment of the bonding device includes in particular a fusion bonding device with a frame, a substrate holder, in particular a vacuum substrate holder for a first substrate, and a substrate holder, in particular a vacuum substrate holder for a second substrate, movement devices for each substrate holder, the bonding pin, measurement and control systems for the alignment of the substrates with one another, at least one vacuum control valve for a plurality of vacuum tracks, the control for the vacuum control valve, the drive, in particular in the form of an electric drive.

The device preferably also contains a take-over apparatus and a substrate rotation apparatus, and at least one robot for the transport of the substrates, compressed air lines, vacuum lines and supply, control computer, data memory, communication lines and devices for the integration of the device in the production factory.

Operation of the Vacuum Control Valve

At least two productive operating states (related to the vacuum control valve, in which a control valve with excess pressure reverses the influencing, so that the substrate is vented in a targeted manner or is subjected to a pressure) can be achieved in a device with vacuum control valve:

In a first operating state, the connection between the vacuum inlet and the vacuum outlet of the vacuum control valve opens, so that an under-pressure prevails at the vacuum outlet or at the vacuum track of the vacuum substrate holder.

In a second productive operating state of the vacuum control valve, the connection between the vacuum inlet and the vacuum outlet in the vacuum control valve is interrupted. In this operating state, an under-pressure or an otherwise technically appropriate pressure state, in particular atmospheric conditions, can be present at the vacuum track of the vacuum substrate holder.

It is conceivable that the vacuum control valve in a third operating state achieves a partially opened and/or partially closed vacuum track in an intermediate position of the vacuum control valve. This operating state can deploy the effect of a throttle valve at the vacuum track of the vacuum substrate holder.

Furthermore, it is conceivable that the vacuum control valve is operated with an excess pressure, so that the substrate is not attracted by suction with opened channels, but is repelled, in particular is subjected to pressure or is vented.

Substrate Holder

A substrate holder is used to fix at least one substrate thereon, in particular a substrate to be bonded. The substrate holders fix the substrate to be bonded on one of the substrate surfaces. The substrate side lying opposite is the substrate surface to be bonded, which forms the bond interface during bonding.

Substrate holders can be constituted in different ways. They can be constituted as follows:
- mechanical fixings, in particular clamps,
- vacuum fixings, in particular with individually controllable/regulated vacuum tracks or vacuum tracks connected to one another,
- electrical fixings, in particular electrostatic fixings,
- electronically actuatable and/or regulated fixings, irrespective of the fixing operating principle,
- magnetic fixings,
- adhesive fixings, in particular so-called gel-pack fixings or as
- fixings with adhesives, in particular actuatable surfaces, The vacuum fixing is the preferred type of fixing. The vacuum fixing preferably includes a plurality of vacuum tracks which emerge at the surface of the substrate holder. The vacuum tracks can preferably be actuated and/or regulated individually. The control valve, in particular constituted as a mechanical vacuum control valve, is used for this purpose.

A plurality of vacuum tracks can preferably be combined, in particular grouped, in a targeted manner into vacuum track segments. The latter can thus be actuated, evacuated and/or flooded individually. It is thus possible to use a plurality of individually actuatable vacuum segments.

The vacuum segments are preferably constituted annular for circular substrates. A targeted, radially symmetrical fixing and/or release of a substrate from the substrate holder carried out in particular from the inside outwards is thus enabled. The vacuum control valve at least partially opens the corresponding vacuum tracks and/or vacuum segments or at least partially closes the vacuum tracks and/or vacuum segments, in order to carry out the fixing or release of the substrates from the substrate holder.

Substrates

The substrates can have any shape, but are preferably round. The diameter of the substrates is in particular industrially standardised.

Substrates made in particular of semiconductor material or glass or glass ceramic or carbon (diamond-like carbon), which are preferably standardised by semi-standard and which are mono- or poly-crystalline, are referred to as wafers.

For wafers, the industrially standard diameters are 1 inch, 2 inches, 3 inches, 4 inches, 5 inches, 6 inches, 8 inches, 12 inches and 18 inches. In principle, any substrate, irrespective of its diameter, can have any shape. Rectangular substrates are currently referred to as panels.

In bonding, two substrates are aligned with one another and bonded with one another. The bonding is based in particular on van-de-Waals' forces in fusion bonding (direct bonding, molecular bonding, silicone direct bonding) or on covalent bonds, preferably in vacuum processes.

Vacuum Control Valve

To influence a fusion bond, the substrates are released from the substrate holder in a defined sequence and bonded together. This influencing takes place on the one hand with the bond pin, on the other hand with the vacuum zone actuation. The vacuum zone actuation is carried out with the preferably regulated operation of at least one of the vacuum control valves. At least one vacuum control valve influences the vacuum of the substrate holder, whereby the pressure is changed in a targeted manner in the valve housing, and correspondingly in the vacuum track and on the vacuum substrate holder.

The change in the pressure in the valve housing or on the vacuum substrate holder is in particular influenced by the shaft, which is coupled with the valve drive and which is passed through the valve housing gas-tight, which transmits the rotary motion of the drive into the interior of the vacuum control valve and which regulates the flow of the vacuum between the inlet openings and the suction ports, in particular opens, closes or partially opens the inlet openings. The supply line of the vacuum is connected in a switchable manner to the suction port provided in the vacuum housing, and in particular a plurality of inlet openings. The drive, in particular a valve drive, particularly preferably a brushless electric motor operated in a controlled manner, is used to generate a movement, in particular a rotation outside the valve housing, which rotates the shaft of the vacuum control valve.

It is possible that the valve drive contains a gear unit, in particular a self-locking gear unit and a brushless electric motor operated in a controlled manner. As a result of this design modification, brakes or similar locking means can advantageously be dispensed with, so that no further heat sources are used.

In the following text, different sets of parameters are disclosed. Several sets of parameters relate to the static features accuracy and precision.

Accuracy is understood to be a systematic error. A systematic error is the deviation of the expected value of a parameter from the true value of the population, determined statically from the random sample quantity. The greater the accuracy, the smaller the value of the deviation, i.e. smaller the systematic error.

Precision is understood to be the scatter of a measured variable around the expected value of the random sample quantity. The greater the precision, the smaller the scatter.

This means in particular for jointed substrate pairs that the deviation from the ideal jointing state is measured and the deviation is quantified in a model, which contains at least a translation in the x-direction, a translation in the y-direction, (spanned ideal jointing plane, i.e. the bond interface), a rotation of the two substrates with respect to one another about the z-axis and the residual error (also known as the run-out).

The present invention in particular minimises the run-out, whereby the error source, which arises from independently switched valves (thermal drift by electrically switched valves, downtimes and delays of the vacuum actuations, etc.), is compensated with a vacuum control valve. Assembly, operation and maintenance outlay can thus be minimised.

The shafts of the vacuum controls, which have different control curves, are preferably replaced for different bonding processes.

The shaft is preferably operated with a circular frequency less than 1/100 Hz, preferably less than 1/10 Hz, particularly preferably less than 1 Hz circular frequency.

The person skilled in the art can control the bonding process from the experimentally determined run-through time of the bond wave. From the run-through time of the bond wave, a control cycle can be derived for the drive of the vacuum valve. In other words, a control cycle means half or a whole rotation of the shaft or a stroke of the translation movement. A cycle time can thus be established from the run-through time.

The cycle time amounts in particular to less than 15 seconds, preferably less than 10 seconds, particularly preferably less than 5 seconds, very particularly preferably less than 3 seconds.

The angular position of the shaft is operated in a regulated manner precisely in the desired angular position, preferably at less than 15 degrees, particular preferably less than 10 degrees, very particular preferably less than 1 degree, with utmost preference less than 0.05 degrees, so that the rotational speed of the shaft has a lesser priority than the accuracy of the rotary motion, which sets the accuracy of the throttling of the vacuum on the vacuum substrate holder. A controlled operation of the vacuum substrate holder with electronic variables, in particular computer-assisted, can thus take place.

The following parameters are of importance for influencing the run-out of the jointed substrate pair:

The temperature (preferably also the temperature of the substrate and of the vacuum substrate holder) is between 0° C. and 300° C., preferably between 15° C. and 120° C., particularly preferably between room temperature (in particular 20° C.) and 75° C.

The temperature fluctuation of the substrate holder is less than +/−5 K, preferably less then +/−3 K, particularly preferably less than +/−1 K, very particular preferably less than +/−0.5 K, in the optimum case less than +/−0.1 K.

The vacuum tightness, in other words the leakage of the vacuum control valve and of the vacuum substrate holder, is less than 10e-5 mbar*l/s, preferably less than 10e-7 mbar*l/s, particular preferably less than 10e-9 mbar*l/s.

The vacuum level in the vacuum line amounts in particular to less than 900 mbar, preferably less than 850 mbar below atmospheric pressure.

In a particularly preferred embodiment of the vacuum supply, a regulated vacuum is used in the vacuum line. The vacuum level lies less than 50 mbar, preferably less than 25 mbar, particularly preferably less than 10 mbar, very particular preferably less than 6 mbar, in the optimum case less than 5 mbar below atmospheric pressure. It is possible that the substrates to be jointed have different temperatures when jointing, in order to be able to influence the jointed substrate stack, in particular the material stress, the form of a non-plane substrate stack.

The selection of the materials and the temperatures belong to the process development. In particular, the aim is pursued such that the bond interface is kept as free as possible from mechanical stresses.

Device

The device is in particular a bonding device.

The bonding device is preferably configured in a modular design according to the customer's wishes, in the building block principle.

The bonding module is preferably erected on a frame, in particular on an actively vibration-damped frame. The frame can be made of natural hard stone, in particular isotropic, fine-grained stone types such as granite, in particular gabbro impala. In other embodiments of the frame, use can be made of functionally integrated reaction resin concrete or functionally integrated technical hydraulically bound concrete.

The functional integration of the frame can include the position and configuration of anchoring points, feeds, targeted stiffening, integrated liquid-operated temperature control. The substrate holder, alignment, measurement, movement, fastening and in part supply components are arranged on the frame.

Apart from the bonding module, the device also contains in particular transport systems, in particular at least one transport robot, at least one prealigner, at least one cleaning module, optionally at least one plasma activation module, at least one loading port, at least one control system, preferably constituted as a computer, at least one operator interface, as well as communication and supply lines for media supply such as compressed air (CDA, clean dry air), vacuum, current, cooling liquid, temperature control liquid.

On account of the preferred modular embodiment, it is particularly advantageous to provide the device in a closed design dust-insulated and/or with so-called filter fan units, i.e. air cleaning units, in order to guarantee cleanness and freedom from dust. Components of the device not directly used for the bonding can be arranged accessible in a local grey room or grey zone for repair and assembly.

In an advantageous embodiment of the bonding device, it is possible for the bonding to be carried out in a gas atmosphere different from the clean room atmosphere (inert gas, functional gas for the cavities of the substrates).

It is possible for the pre-bond, i.e. the bonding process, to be carried out in under-pressure, preferably in a vacuum, particularly preferably in a high vacuum, very particularly preferably in an ultra-high vacuum.

In particular, the vacuum control valve can be arranged on the rear side of the substrate holder in such a way that the dust-sensitive bonding module is not opened for the replacement of the shaft, but rather the grey zone is used for this purpose. A particle loading of the bond can thus be further reduced. As a result of the arrangement of the vacuum control valve in the grey zone, the parasitic thermal load of the bonding module can be reduced as a further advantage, which in turn minimises the run-out.

It is possible to store different shafts for different bonding sequences in the grey zone in storage places provided for the purpose.

The time constant of the control for influencing the course of the bond wave is preferably $1/10$, particularly preferably $1/100$, particularly preferably $1/1000$ of the time constant of the most rapid movement of the device. The control speed (speed of the actuators) is the same speed as the fastest movement of the device.

The controllers are constituted in particular as computer programs and routines. The embodiment of the controllers is particularly advantageously configured for accuracy (accuracy of pretensioning, positioning, dimensional stability) and rapidity. However, an overswing or an over-stretch of the controlled variable deviating from the setpoint value is prevented. The control parameters are derived from the difference of the setpoint value and from the actual value and interpreted such that "rocking", in particular harmonic vibrations or transients are prevented at all times of the fastening of the substrate by means of the method for bonding and the bonding process.

Method

The use of the vacuum control valve for a fusion bond is understood as an in particular independent invention.

The substrate preparations, the centring of the substrates and the rotation (flipping) of at least one of the substrates are understood as preparatory, optional process steps.

In a first process step, the vacuum control valve is set in an initial position. A fluid flow is thus initiated by means of vacuum from the surface of the substrate holder in the direction of the vacuum control valve.

In a second process step, a substrate is loaded. The loading sequence includes the transport of the substrate to the vacuum substrate holder.

During this transport, the following tasks in particular are dealt with.

the flipping of a substrate,
the transfer of the substrate from the arm of the transport robot onto a plurality, preferably 3 pins, in particularly preferred applications vacuum pins, and the
movement of the substrate in the direction of the substrate holder by means of pins.

In a third process step, a substrate is fastened on the vacuum substrate holder. For this purpose, the under-pressure is set by means of the shaft of the vacuum control valve, in particular set in a regulated manner. The valve drive, in particular a motor, rotates the shaft of the vacuum control valve. The movement of the shaft influences the fluid flow between the inlet openings, i.e. vacuum channels of the vacuum substrate holder and of the suction ports.

It is conceivable for at least one substrate to be subjected to suction radially symmetrically from the centre-point in the direction of the edge of the substrate. Both the vacuum substrate holder and also the vacuum control valve are however in a position to be able to run through any suction sequences.

In a fourth process step (which can take place optionally simultaneously, preferably with a time lag in respect of the third process step), a second substrate is fixed on the second vacuum substrate holder similar to the second and third process step. The rotation, or the flipping, of the substrate is to be carried out only if required.

In a fifth process step, the substrates to be bonded are aligned with one another.

In a sixth process step, the bonding sequence is initiated and carried out, in which the vacuum control valves in particular are synchronised with one another and at least one substrate is released in controlled manner. The shaft of a vacuum control valve is driven in a regulated manner by the vacuum drive, such that the fluid flow is at least interrupted. Optionally, the fluid flow in the vacuum track can even be reversed by the under-pressure (vacuum) to excess pressure (repulsion).

In the bonding sequence, a bond pin, the contact between the first and the second substrate in a connection point in the bonding interface, can initiate the bond wave.

The course of the bonding sequence as a regulated process step is preferred, because the distortions can then at least be reduced, preferably minimised, most preferably eliminated.

The pre-bond or the bond is produced after a complete run-through of the bond wave in the bonding interface of the substrate stack.

In a seventh process step, the substrate stack is unloaded from the vacuum substrate holder.

In an optional eighth process step, the substrate stack is measured, in order to check the alignment and jointing success. If a run-out is below a fixed threshold value, the substrate stack is released for further processing.

If, on the other hand, a run-out value above the threshold value is reached, the substrate stack is in particular separated and again added to the bonding process and scrapped in the case of an inseparably connected substrate stack.

BRIEF DESCRIPTION OF THE DRAWINGS

Further advantages, features and details the invention emerge from the following description of preferred examples of embodiment and with the aid of the drawings. In the drawings.

DETAILED DESCRIPTION OF THE INVENTION

Figure 1:
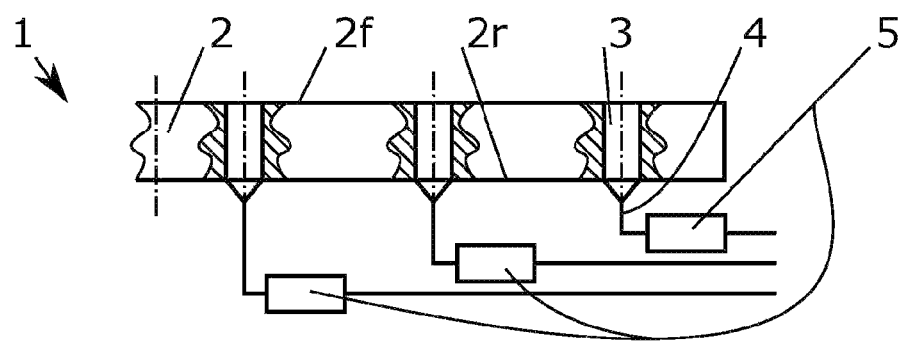
FIG. 1 shows a diagrammatic structural sketch of a control valve of the prior art.

In the figures, identical components or components with the same function are denoted by the same reference numbers.

Substrate holder device 1 contains a substrate holder 2 with a substrate holder surface 2*f*, on which surface the substrate to be processed is placed and fixed. Furthermore, substrate holder 2 has a substrate holder rear side 2*r* facing away from substrate holder surface 2*f*, which is accessible in particular for the vacuum connections 3 and individual vacuum lines 4. Vacuum lines 4 are connected to individual control/regulating valves 5, which are fluidically connected to the device control (not represented) and to a vacuum central line or a vacuum supply (not represented) for the device.

A dedicated vacuum line 4 and a dedicated control/regulating valve 5 is required for each vacuum connection 3 in the prior art. The space requirement and the complexity of the supply units of a standard substrate holder, in particular vacuum substrate holder, have thus increased extremely in recent years.

Figure 2:
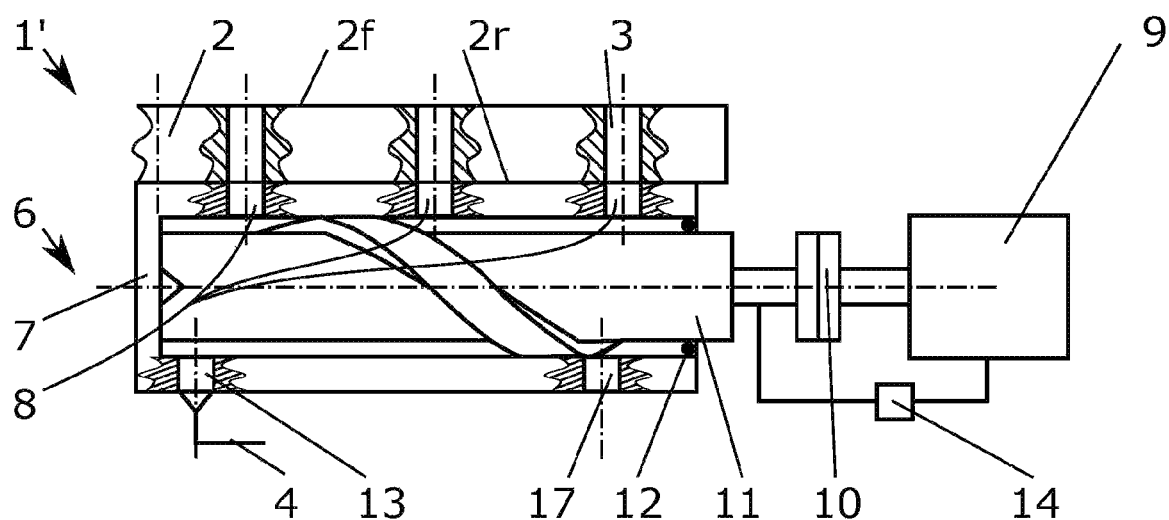
FIG. 2 shows a diagrammatic structural sketch of an embodiment of the substrate holder device according to the invention with a control valve.

On the other hand, vacuum control valve 6 in FIG. 2 offers the possibility of controlling a plurality of openings with only one control valve, which can in particular be operated purely mechanically.

FIG. 2 represents a diagrammatic structural sketch of an embodiment of a substrate holder device 1' according to the invention with a control valve 6.

As already explained in FIG. 1, substrate holder device 1' contains a substrate holder 2 with a substrate holder surface 2f, on which surface the substrate to be processed is placed and fixed. Furthermore, substrate holder 2 includes a substrate holder rear side 2r facing away from the substrate holder surface 2f. At least one vacuum control valve 6 is provided gas tight on substrate holder rear side 2r of substrate holder 2.

In an advantageous embodiment of substrate holder device 1', vacuum connections 3 and corresponding opening 8 or inlet openings 8 of valve housing 7 of vacuum control valve 6 can be produced in a common clamping operation of the valve housing 7 with substrate holder 2. Production is thus more cost-effective due to the avoidance of narrow tolerances.

Control element 11 constituted as shaft 11 is located in valve housing 7. Shaft 11 has at least one circumferential trapezoidal thread, which can close off the inlet openings of valve housing 7 gas-tight depending on the angular position of shaft 11. The thread pitch of the shaft can describe a form and a path, which supports control of the suction and the release of the substrate in the optimum manner, i.e. is a mathematically constant trajectory of a function.

Instead of a trapezoidal thread, any forms of control projection on the shaft are conceivable, as long as the outer theoretical lateral surface can close off inlet openings 8 cylindrically in the valve housing. In other words, a trapezoidal thread represents a kind of control projection. The width of a control projection can be adapted by calculation or on an empirical-experimental basis. The width of the control projection is theoretically possible from greater than 0 degrees to less than/equal to 360 degrees. Production and tolerances have to be observed, for which reason opening angles of 0.01 degrees to 359.99 degrees are possible depending on the diameter of the shaft. In further embodiments, the opening angles amount to greater than 10 degrees, preferably greater than 180 degrees, particular preferably greater than 269 degrees, very particularly preferably greater than 314 degrees.

The vacuum in valve housing 7 is guaranteed by a vacuum port 13, which can be fluidically connected to a vacuum line 4 of the device, i.e. to the supply line of the device.

Optionally, at least one venting port 17, preferably as a pressure difference port, is constituted in particular for the release of the substrate from the substrate holder surface 2f.

The control can thus switch in particular between two defined pressure levels, in particular at least one inlet opening 8 can quickly apply a different pressure when releasing the substrate in a controlled manner.

In other words, at least one vacuum port 13 can be subjected to excess pressure or to atmospheric pressure, so that an additional pressure level is provided in the vacuum valve, in order in particular to be able to release the substrate from the substrate holder. As a further application, a targeted, in particular local pretensioning of the substrate with a pressure difference is possible.

Valve housing 7 separates its interior with a vacuum gas-tight from the outer atmosphere. Valve housing 7 can also separate its interior from the outer atmosphere gas-tight when the pressure is reversed to excess pressure.

Shaft 11 is driven by a valve drive 9, which is connected or can be connected mechanically to the shaft, in particular via a coupling 10. Valve drive 9 generates a movement, in particular a rotation outside valve housing 7, which rotates shaft 11 via coupling 10 and thus changes the angular position of shaft 11. Shaft 11 is passed through valve housing 7 gas-tight. A seal 12 particularly advantageously provides for the gas-tight feed-through of shaft 11. Shaft 11 transmits the rotary movement from drive 9 into the interior region of vacuum control valve 6.

A sensor 14 is represented for a controlled operation of drive 9 or for the measurement in particular of the angular position of shaft 11. By means of the controlled operation of drive 9, the flow of the vacuum between inlet openings 8 and suction ports 13 (not all represented) can be regulated, in particular inlet openings 8 can be opened or closed or partially opened.

Substrate holder device 1, 1' contains other supply, fastening and measuring means not represented, which in particular enable the controlled, aligned bonding of substrates with a minimal residual error (run-out).

Figure 3:
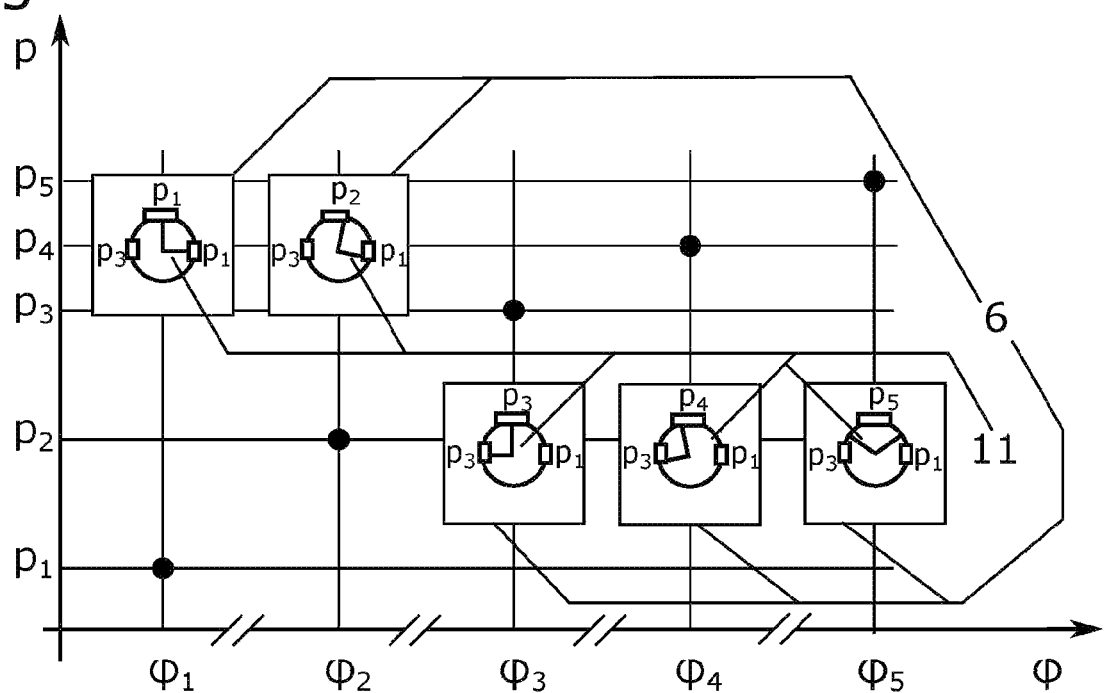
FIG. 3 shows a chart of the connection between the adjustment angle of the shaft and the pressure of the control valve and FIG. 4 shows a diagrammatic structural sketch of an exemplary control element.

FIG. 3 represents a chart of the connection between exemplary adjustment angles of shaft 11 and pressure p of the vacuum control valve in particular at inlet openings 8.

With an adjustment $\varphi.1$ of shaft 11, at least one vacuum port 13 with a pressure p1 is connected directly to at least one inlet opening 8, so that a pressure p1 prevails at this inlet opening 8.

With an adjustment angle $\varphi.2$ of shaft 11, at least one vacuum port 13 in particular with throttled pressure p2 is connected to at least one inlet opening 8, so that a pressure p2 prevails at this inlet opening 8.

With an adjustment angle $\varphi.3$ of shaft 11, at least one vacuum port 13 is connected with a pressure p3 to at least one inlet opening 8, so that a pressure p3 prevails at inlet opening 8.

With an adjustment angle $\varphi.4$ of shaft 11, at least one vacuum connection 13 is connected in particular with a throttled pressure p4 to at least one inlet opening 8, so that a pressure p4 prevails at this inlet opening 8.

With an adjustment angle $\varphi.5$ of shaft 11, a vacuum port 13 with a pressure p1 or p3 is connected to a least one outlet opening 8, so that a pressure p5 prevails at this inlet opening 8. This state can in particular include a pressure in the interval between p1 up to atmospheric pressure, so that this switching state of shaft 1I generates an uncertain pressure state.

On the assumption that p4 was to be atmospheric pressure, the representation of the chart applies for vacuum.

If vacuum control valve 6 in another embodiment is operated with excess pressure at port 13, the pressure relationships shown do not apply.

Figure 4:
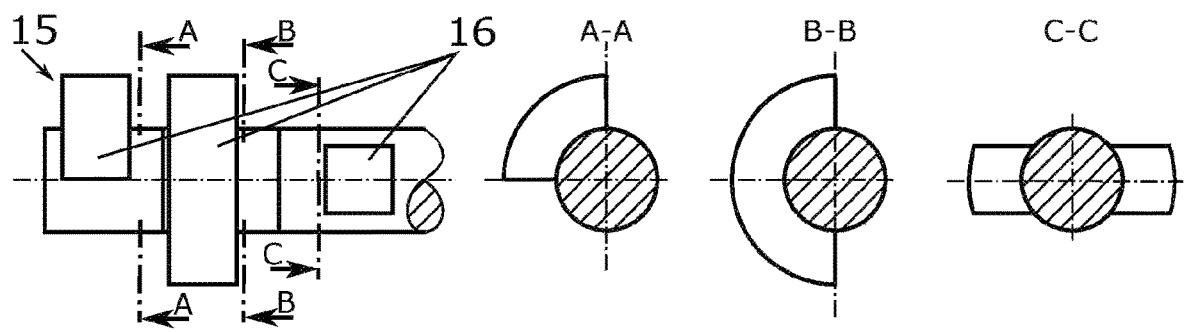

FIG. 4 is a diagrammatic structural sketch of an embodiment of shaft 11, wherein control projection 15 is constituted as a segment shaft 15.

Segment shaft 15 includes segments 16. Segments 16 are matched to the distances of inlet openings 8 of the vacuum control valve not shown.

Segments 16, like a continuous shaft 11, can thus also open or partially close (in other words throttle) or close gas-tight the inlet openings depending on the angular position of segment shaft 15. The segment design of segment shaft 15 has the structural advantage that flexibility in the planning of the control of a fusion bond is guaranteed by a modification of the vacuum control valve by the replacement of segments. With an infinite number of different segments, any control tasks of the vacuum control valve (not represented) can be carried out with sufficient accuracy. In particular, a segment increment of in each case 15 degrees (locking segments of 15 degrees, 30 degrees, 45 degrees etc.) is regarded as structurally advantageous.

In other words, segments 16 are constituted with different opening angles or closing angles (see in this regard sections A-A, B-B, C-C) as exemplary representations. The vacuum control remains more flexibly adjustable with the change of the angular position of the segments with respect to one another. The segments can, like a cam shaft, contain a cam, as sections A-A and B-B illustrate, as well as more cams (two as in C-C).

The person skilled in the art knows how segments 16 should be produced and it is general knowledge to the designer to solve problems of assembly, adjustment, fixing and anti-twist protection of segments 16 of segment shaft 15 with respect to one another as technical problems.

In particular, the outer lateral surfaces of the segments, preferably in particular the cams, are at least polished and worked into the valve housing with a gas-tight fit. The sealing functional surfaces, i.e. the fit of shaft 11, in particular the fit of the segments of the valve housing, can in particularly be honed.

The opening angle of a segment 16 is theoretically possible from 0.01 degrees (and complementary thereto a closing angle of 360-opening angle in the case of a cam on the segment) up to 359.9 degrees. In further embodiments of the segments, the opening angle is greater than 10 degrees, preferably greater than 180 degrees, particularly preferably greater than 269 degrees, very particularly preferably greater than 314 degrees. The calculation path applies to segments 16 with a plurality of cams, as well as to shafts similar to a screw thread or worm thread or freeform surface analogously.

In a preferred embodiment (not represented) of shaft 11 or in particular segment shaft 15, segments 16 or an embodiment similar to a double-lead thread with two ports 13 of vacuum control valve 6 can supply two different defined pressures to the valve and, correspondingly to the angular position of the shaft, can supply inlet openings 8. An advantage of this embodiment is the defined incrementation of the pressure in vacuum control valve 6 with the purpose of being able to influence more precisely the fastening and the release of the substrate on substrate holder 2, in particular the vacuum substrate holder, in order to minimise the run-out. The complexity of the construction continues to be at the same level, so that the advantages of the vacuum control valve are coupled with additional advantages In other words, the preferred embodiment (not represented) of shaft 11 or of segment shaft 15 enables a continuous media separation for defined pressures, in particular for venting.

A vacuum control valve 6 with at least two vacuum supplies 13 and a shaft 11, which can generate two chambers with different pressures, can if necessary be operated as a vacuum control valve 6 with a vacuum supply 13.

LIST OF REFERENCE NUMBERS

1, 1' substrate holder device
2 substrate holder
2f substrate holder surface
2r substrate holder rear side
3 vacuum connections, connection openings
4 vacuum line
5 electronic control valve
6 control valve, vacuum control valve
7 valve housing
8 inlet openings, openings
9 valve drive
10 coupling
11 control element, shaft
12 seal
13 port, vacuum port
14 sensor
15 segment shaft
16 control projection, segments
17 venting port, pressure difference port

What is claimed is:

1. A substrate holder device, comprising:
   at least one control valve, comprising:
      a valve housing with at least one port;
      a drivable control element held gas-tight in the valve housing, the control element comprising at least one control projection, the at least one control projection being defined in a form of a thread or in a form of two opposite-running threads; and
      at least two openings formed in the valve housing and fluidically connectable to the port; and
   at least one substrate holder with a substrate holder surface and a substrate holder rear side,
   wherein the control element is configured to at least partially close the at least two openings by a driving of the control element, and
   wherein the at least one control projection is configured to at least partially close the at least two openings.

2. The substrate holder device according to claim 1, wherein the control element is further configured to carry out an individual opening, closing or partial closing of the at least two openings in a specific sequence by the driving of the control element.

3. The substrate holder device according to claim 1, wherein the control element is defined as a shaft, and
   wherein the driving takes place in a rotational movement around the shaft.

4. The substrate holder device according to claim 1, wherein the control element is defined as a piston, and
   wherein the driving takes place in an axial movement along the piston.

5. The substrate holder device according to claim 1, wherein the control element is replaceable.

6. The substrate holder device according to claim 1, wherein the valve housing is arranged with respect to the substrate holder in such a way that at least two openings of the at least two openings are aligned in a radial direction proceeding from a centre-point of the substrate holder surface.

7. The substrate holder device according to claim 1, wherein the valve housing comprises at least three of the openings offset along a straight line.

8. The substrate holder device according to claim 1, wherein the driving takes place by means of a valve drive that is coupled with the control element, and
   wherein the valve drive is arranged outside the valve housing.

9. The substrate holder device according to claim 1, wherein at least two connection openings are formed between the substrate holder surface on the substrate holder rear side, and wherein the at least two connection openings are connected gas-tight to the at least two openings of the valve housing of the at least one control valve so that a vacuum acting or a pressure acting through the at least one port is provided at the at least two connection openings in a region of the substrate holder surface.

10. The substrate holder device according to claim 1, wherein a substrate arranged on the substrate holder surface is fixed, released and/or vented depending on a specific sequence of the control valve pre-settable by the at least one control projection in a region of vacuum connections.

11. A bonding device for bonding at least two substrates facing one another, comprising:
- at least one substrate holder device, the substrate holder device comprising:
  - at least one control valve, comprising:
  - a valve housing with at least one port;
  - a drivable control element held gas-tight in the valve housing, the control element comprising at least one control projection, the at least one control projection being defined in a form of a thread or in a form of two opposite-running threads; and
  - at least two openings formed in the valve housing and fluidically connectable to the port; and
  - at least one substrate holder with a substrate holder surface and a substrate holder rear side,
- wherein the control element is configured to at least partially close the at least two openings by a driving of the control element,
- wherein the at least one control projection is configured to at least partially close the at least two openings,
- wherein the driving takes place by means of a valve drive that is coupled with the control element,
- wherein the valve drive is arranged outside the valve housing, and
- wherein a bond wave is controlled by a drive speed of the valve drive and by vacuum acting or a pressure acting at the port.

12. A method for bonding at least two substrates facing one another, comprising:
- driving a drivable control element of a control valve to at least partially close at least two openings formed in a valve housing of the control valve, the at least two openings being fluidically connectable to a port of the valve housing of the control valve, the control element having at least one control projection, the at least one control projection being defined in a form of a thread or in a form of two opposite-running threads, the driving taking place by means of a valve drive that is coupled with the control element, the valve drive being arranged outside the valve housing, and
- at least partially closing the at least two openings via the at least one control projection,
- wherein a bond wave is controlled by a drive speed of the valve drive and by vacuum acting or a pressure acting at the port, and
- wherein a propagation speed and/or a form of the bond wave spreading radially is influenced by a substrate holder device, the substrate holder device including the control valve and at least one substrate holder with a substrate holder surface and a substrate holder rear side.

13. The method according to claim 12, wherein the influencing of the propagation speed and/or the form of the bond wave takes place depending on a movement speed of the control element and on the vacuum acting or the pressure acting at the port.

* * * * *